(12) United States Patent
How

(10) Patent No.: US 8,048,781 B2
(45) Date of Patent: Nov. 1, 2011

(54) METHODS AND SYSTEMS FOR PACKAGING INTEGRATED CIRCUITS

(75) Inventor: You Chye How, Melaka (MY)

(73) Assignee: National Semiconductor Corporation, Santa Clara, CA (US)

( * ) Notice: Subject to any disclaimer, the term of this patent is extended or adjusted under 35 U.S.C. 154(b) by 677 days.

(21) Appl. No.: 12/019,561

(22) Filed: Jan. 24, 2008

(65) Prior Publication Data

US 2009/0189279 A1    Jul. 30, 2009

(51) Int. Cl.
*H01L 21/301* (2006.01)
*H01L 21/46* (2006.01)
*H01L 21/78* (2006.01)
*H01L 21/44* (2006.01)

(52) U.S. Cl. ........ 438/464; 438/108; 438/113; 438/458; 257/E21.503

(58) Field of Classification Search .................. 438/107, 438/108, 113, 464, 465, 458; 257/E21.503, 257/E21.599
See application file for complete search history.

(56) References Cited

U.S. PATENT DOCUMENTS

| | | |
|---|---|---|
| 3,772,064 A | 11/1973 | Mendelson et al. |
| 4,442,137 A | 4/1984 | Kumar |
| 5,206,181 A | 4/1993 | Gross |
| 5,316,853 A | 5/1994 | Shibata et al. |
| 5,356,949 A | 10/1994 | Komiyama et al. |
| 5,597,767 A | 1/1997 | Mignardi et al. |
| 5,827,394 A | 10/1998 | Lu |
| 5,923,995 A | 7/1999 | Kao et al. |
| 5,960,260 A | 9/1999 | Umehara et al. |
| 5,969,426 A | 10/1999 | Baba et al. |
| 6,001,671 A | 12/1999 | Fjelstad |
| 6,023,094 A | 2/2000 | Kao et al. |
| 6,025,650 A | 2/2000 | Tsuji et al. |
| 6,175,162 B1 | 1/2001 | Kao et al. |
| 6,176,966 B1 | 1/2001 | Tsujimoto et al. |
| 6,214,703 B1 | 4/2001 | Chen et al. |
| 6,235,366 B1 | 5/2001 | Matsumoto et al. |
| 6,319,754 B1 | 11/2001 | Wang et al. |

(Continued)

FOREIGN PATENT DOCUMENTS

JP        54-131537        10/1979

OTHER PUBLICATIONS

U.S. Appl. No. 11/958,288, filed Dec. 17, 2007.

(Continued)

*Primary Examiner* — Shouxiang Hu
(74) *Attorney, Agent, or Firm* — Beyer Law Group LLP

(57) ABSTRACT

Methods of packaging integrated circuits are described. One method relates to attaching a singulated device wafer to a substrate. The singulated device wafer includes a multiplicity of integrated circuit dice arranged in a first configuration. The method also involves a substrate, which includes a sacrificial semiconductor wafer having device areas with metalized contacts. The device areas on the substrate may be arranged in a configuration matching that of the dice on the device wafer. The method also entails aligning the singulated device wafer as a whole with the substrate so that the dice of the device wafer are positioned substantially simultaneously over associated device areas on the substrate. The method also involves attaching the dice from the singulated wafer as a whole substantially simultaneously to the substrate such that each die of the device wafer is attached to an associated device area of the substrate.

19 Claims, 10 Drawing Sheets

U.S. PATENT DOCUMENTS

| | | |
|---|---|---|
| 6,333,252 B1 | 12/2001 | Jung et al. |
| 6,383,833 B1 | 5/2002 | Silverbrook |
| 6,398,892 B1 | 6/2002 | Noguchi et al. |
| 6,444,310 B1 | 9/2002 | Senoo et al. |
| 6,610,167 B1 | 8/2003 | Glenn et al. |
| 6,623,594 B1 | 9/2003 | Yamamoto et al |
| 6,702,910 B2 | 3/2004 | Noguchi et al. |
| 6,709,953 B2 | 3/2004 | Vasquez et al. |
| 6,746,896 B1 * | 6/2004 | Shi et al. ................. 438/108 |
| 6,797,541 B2 | 9/2004 | Chun et al. |
| 6,812,552 B2 | 11/2004 | Islam et al. |
| 6,858,919 B2 | 2/2005 | Seo et al. |
| 6,873,032 B1 | 3/2005 | McCann et al. |
| 6,873,059 B2 | 3/2005 | Amagai et al. |
| 6,943,434 B2 | 9/2005 | Tangpuz et al. |
| 6,953,988 B2 | 10/2005 | Seo et al. |
| 6,964,881 B2 | 11/2005 | Chua et al. |
| 6,967,125 B2 | 11/2005 | Fee et al. |
| 7,009,286 B1 | 3/2006 | Kirloskar et al. |
| 7,095,096 B1 | 8/2006 | Mostafazadeh |
| 7,160,755 B2 | 1/2007 | Lo et al. |
| 7,244,664 B2 | 7/2007 | Blair et al. |
| 7,268,012 B2 | 9/2007 | Jiang et al. |
| 7,294,911 B2 | 11/2007 | Lee et al. |
| 7,432,114 B2 * | 10/2008 | Teshirogi et al. ................. 438/3 |
| 7,507,603 B1 | 3/2009 | Berry et al. |
| 2002/0093076 A1 * | 7/2002 | Fujii et al. ................. 257/620 |
| 2003/0143819 A1 | 7/2003 | Hedler et al. |
| 2004/0038510 A1 * | 2/2004 | Munakata et al. ................. 438/613 |
| 2004/0058478 A1 | 3/2004 | Islam et al. |
| 2004/0104491 A1 | 6/2004 | Connell et al. |
| 2004/0106233 A1 | 6/2004 | Lin et al. |
| 2004/0161876 A1 | 8/2004 | Tandy et al. |
| 2004/0191510 A1 | 9/2004 | Kiuchi et al. |
| 2005/0067680 A1 | 3/2005 | Boon et al. |
| 2005/0070095 A1 | 3/2005 | Sharan et al. |
| 2005/0153522 A1 * | 7/2005 | Hwang et al. ................. 438/455 |
| 2007/0259515 A1 * | 11/2007 | Paik et al. ................. 438/612 |
| 2008/0241991 A1 | 10/2008 | Poddar et al. |
| 2009/0152707 A1 | 6/2009 | How et al. |

OTHER PUBLICATIONS

U.S. Appl. No. 11/484,144, filed Jul. 10, 2006.
U.S. Appl. No. 11/691,428, filed Mar. 26, 2007.
Office Action dated May 28, 2009 in U.S. Appl. No. 11/484,144.
Office Action dated Nov. 20, 2009 in U.S. Appl. No. 11/958,288.
Office Action dated Feb. 4, 2010 in U.S. Appl. No. 11/484,144.
Notice of Allowance dated Mar. 29, 2010 from U.S. Appl. No. 11/958,288.
Final Office Action dated May 28, 2010 in U.S. Appl. No. 11/484,144.
Office Action dated Feb. 2, 2011 from U.S. Appl. No. 11/484,144.
Notice of Allowance dated Sept. 10, 2010 from U.S. Appl. No. 12/789,348.

* cited by examiner

METHODS AND SYSTEMS FOR PACKAGING INTEGRATED CIRCUITS

FIELD OF THE INVENTION

The present invention relates generally to the packaging of integrated circuit (IC) devices. More particularly, the invention relates to panel level arrangements and methods for packaging integrated circuit dice using a wafer as a substrate panel.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connection to external devices.

Although existing techniques for fabricating leadframes and for packaging integrated circuits using leadframe technology work well, there are continuing efforts to develop even more efficient designs and methods for packaging integrated circuits.

SUMMARY OF THE INVENTION

In one aspect, a method for packaging integrated circuit devices is described. The method relates to attaching a singulated device wafer to a substrate. The singulated device wafer includes a multiplicity of integrated circuit dice arranged in a first configuration. A mount tape or some other form of wafer support may hold the singulated dice in place and maintain the configuration. The method also involves a substrate, which includes a sacrificial semiconductor wafer having device areas with metalized contacts. The device areas on the substrate may be arranged in a configuration matching that of the dice on the device wafer. The method entails aligning the singulated device wafer as a whole with the substrate so that the dice of the device wafer are positioned substantially simultaneously over associated device areas on the substrate. The method also involves attaching the dice from the singulated wafer as a whole substantially simultaneously to the substrate such that each die of the device wafer is attached to an associated device area of the substrate.

The step of attaching the singulated wafer to the substrate may be performed in a number of ways. In some embodiments, solder bumps are formed over selected I/O pads on the dice of the singulated wafer. The solder bumps may then be reflowed to create physical and electrical connections between the I/O pads on the dice and the contacts in the device areas.

In some embodiments, portions of the dice and contacts are encapsulated with a molding material. In such embodiments, the semiconductor material of the sacrificial semiconductor wafer may be sacrificed leaving at least portions of the contacts exposed to facilitate connection with external devices. In some embodiments the encapsulation material holds the device areas together after the semiconductor material of the sacrificial wafer has been sacrificed. After encapsulation, the device areas may be singulated, thus forming a multiplicity of integrated circuit die packages.

In another aspect, a method for preparing integrated circuit dice for packaging begins with an unsingulated device wafer including a multiplicity of dice. In some embodiments, the back surface of the unsingulated device wafer may be metalized. The active surface of the unsingulated device wafer is adhered to a first mount tape. The device wafer is singulated such that the multiplicity of dice remain adhered to the first mount tape. The multiplicity of dice are then attached as a whole to a second tape. Afterward, the first mount tape is removed. It should be appreciated that throughout this process, the dice may remain in their original wafer level configuration. In various embodiments, the dice may then be attached simultaneously to device areas on a suitable substrate, such as that described above.

In yet another aspect, an arrangement suitable for use in packaging integrated circuit dice is described. The arrangement includes a singulated device wafer including a multiplicity of integrated circuit dice arranged in a first configuration. Also included in the arrangement is a substrate formed from a sacrificial semiconductor wafer. The substrate has a multiplicity of device areas arranged upon it in a second configuration. The two configurations are aligned with one another such that the active surface of each die is positioned over an associated device area on the substrate. Solder joints physically and electrically connect I/O pads on the active surface of each die with corresponding contacts on an associated device area on the substrate.

BRIEF DESCRIPTION OF THE DRAWINGS

The invention and the advantages thereof, may best be understood by reference to the following description taken in conjunction with the accompanying drawings in which.

In the drawings, like reference numerals are sometimes used to designate like structural elements. It should also be appreciated that the depictions in the figures are diagrammatic and not to scale.

DETAILED DESCRIPTION OF THE PREFERRED EMBODIMENTS

The present invention relates generally to integrated circuits. More particularly, the invention relates to an improved pseudo-wafer-level method of packaging integrated circuits. In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

Figure 1:
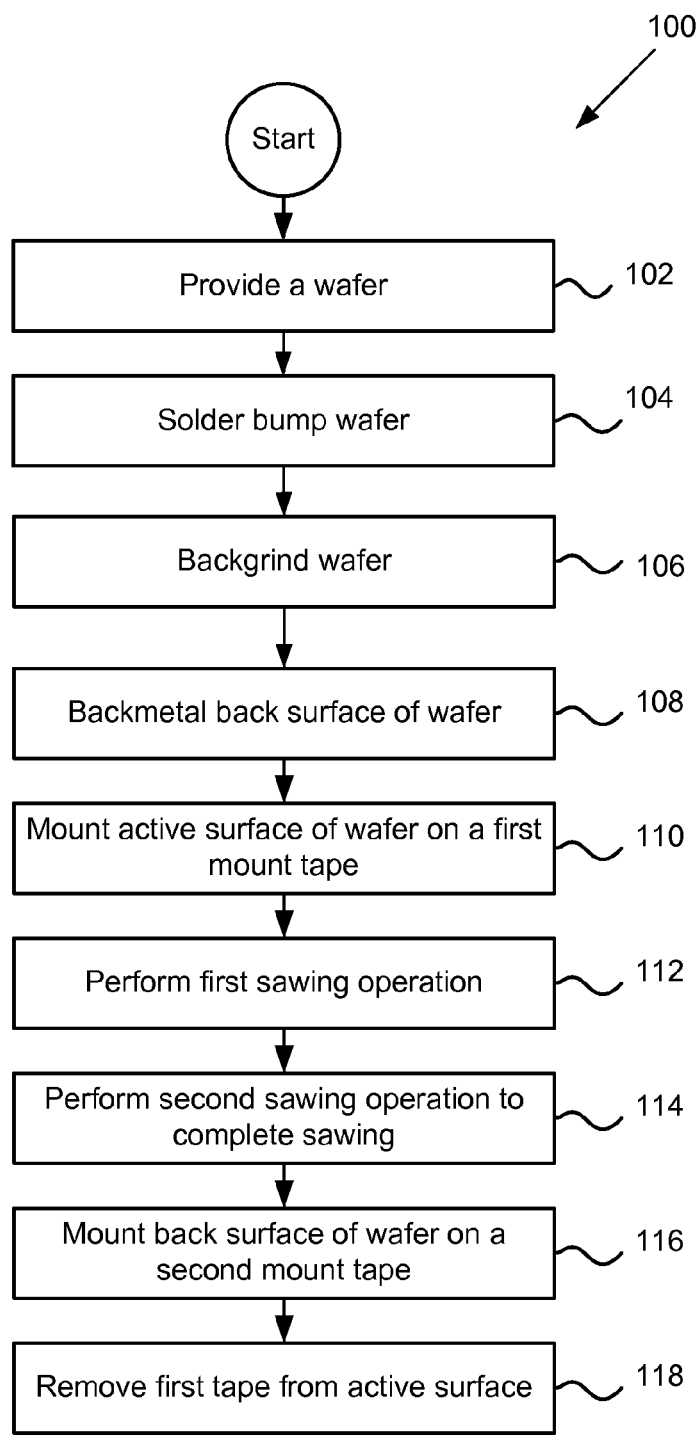
FIG. 1 is a flowchart illustrating a process of preparing a device wafer suitable for use in the packaging of integrated circuits in accordance with one embodiment of the present invention.
Figure 2:
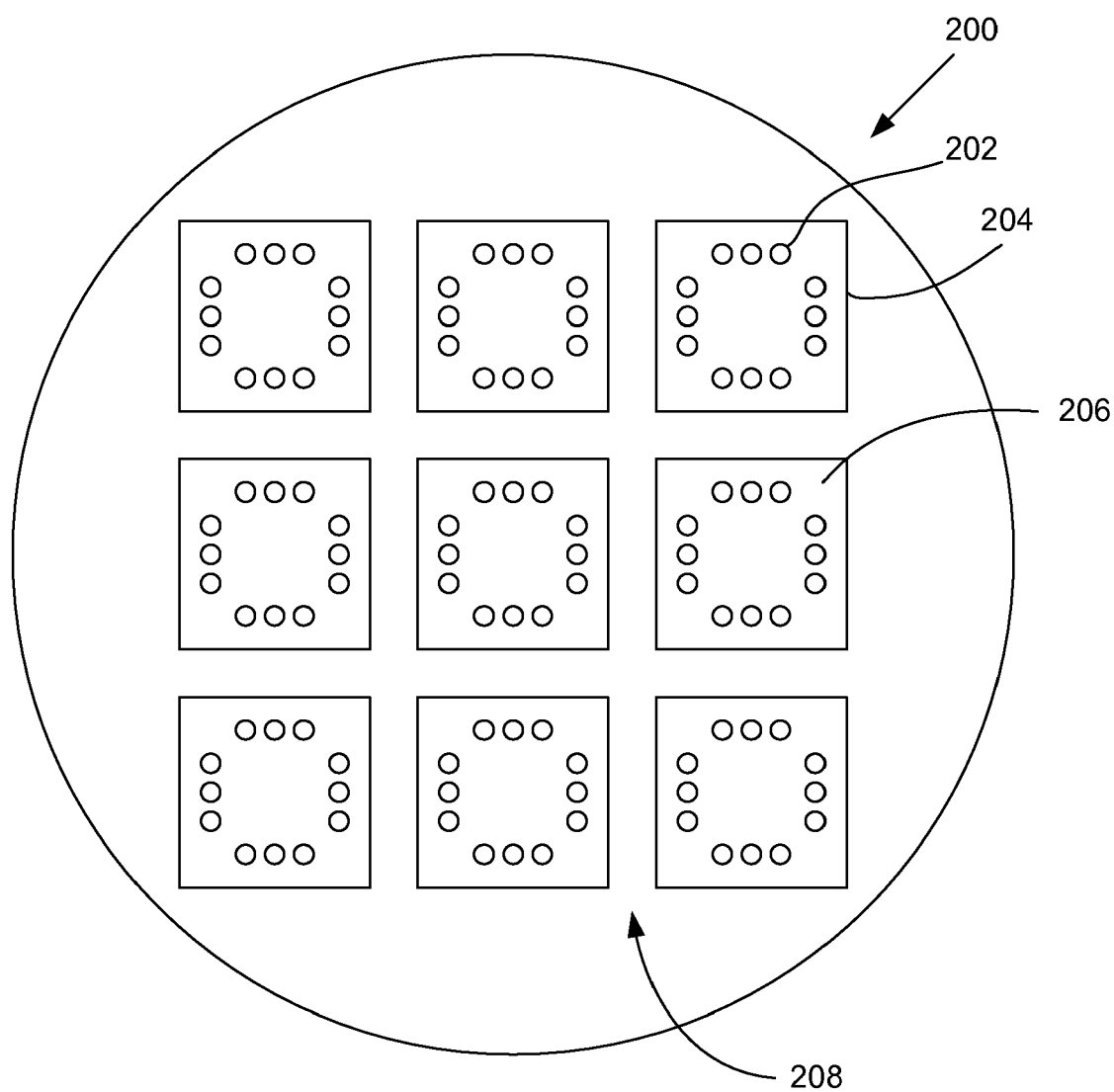
FIG. 2 illustrates a diagrammatic top view of an unsingulated device wafer.
Figure 3A:
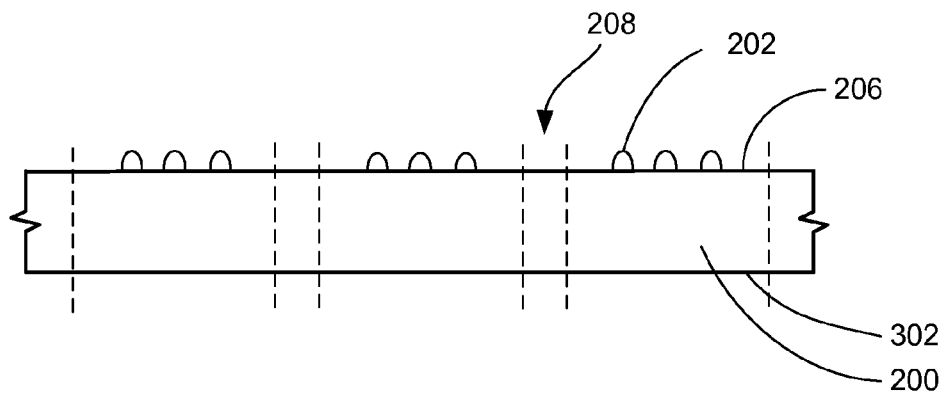
FIGS. 3A-3G illustrate diagrammatic cross-sectional side views of a device wafer at various steps in the process shown in FIG. 1 in accordance with one embodiment of the present invention.

Referring initially to FIG. 1 and further in view of FIG. 2 and FIGS. 3A-3G, a process 100 of preparing a device wafer for packaging in accordance with one embodiment of the present invention will be described. Initially, in step 102, a device wafer is provided. FIG. 2 illustrates a diagrammatic top view of an example device wafer 200 having a number of integrated circuit dice 204. Although in the diagrammatic illustration only a few dice 204 are shown, it will be appreciated by those familiar with the art that state of the art wafers tend to have on the order of hundreds to thousands, or tens of thousands, of dice formed therein and it is expected that even higher device densities will be attained in future wafers. FIG. 2 also depicts projected scribe lines 208 (sometimes referred to as saw streets), which run between each die 204 and define the perimeter of each die. The scribe lines 208 generally indicate where the wafer 200 will be singulated (e.g., sawn) to provide individual singulated dice 204. In the illustrated embodiment, the dice 204 are shown with uniform lengths and widths, however, this is not a requirement. In fact, as will become apparent from the following description, certain embodiments of the present invention are especially useful in efficiently packaging dice having varying, and even widely varying, footprints. FIG. 3A, which is a diagrammatic side view of a portion of the device wafer 200 illustrated in FIG. 2, indicates projected scribe lines 208 with pairs of dotted lines.

In step 104, solder bumps 202 are formed over I/O pads on the active surface 206 of each die 204 at the wafer level. As will be appreciated by those familiar with the art, the I/O pads may be the original bond pads on the original active surfaces of the dice 204, but are more often bond pads that have been redistributed from the original bond pads using conventional redistribution techniques. The solder bumping may be performed using any of a number of conventional processes such as, by way of example, ball-dropping preformed solder balls on the I/O pads, electroplating a solder layer over the I/O pads, or screen printing a solder paste over the I/O pads. Additionally, a wide variety of conventional solder materials may be used to form the solder bumps 202, such as, for example, an alloy of SnAgCu.

If it is desirable to thin the wafer 200, the back surface 302 of the wafer may be subjected to a backgrinding operation in step 106. Backgrinding reduces the thickness of device wafer 200 to bring the wafer into conformance with a desired thickness. Backgrinding may be accomplished by any of a number of methods known in the art. It should be appreciated that backgrinding is an optional operation as the wafer 200 may conform to a desired thickness without backgrinding.

Figure 3B:
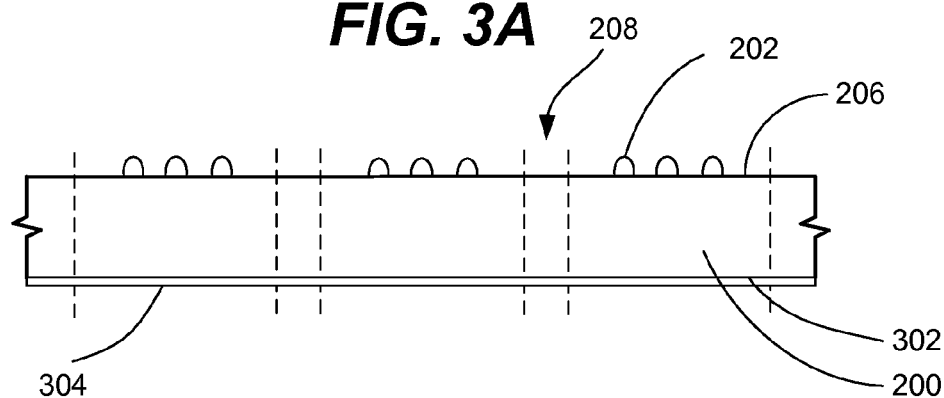
Figure 3C:
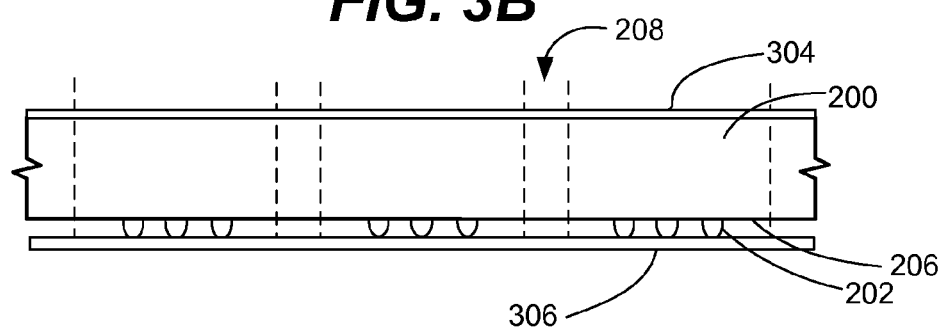

In the illustrated embodiment, a backmetal layer 304 is deposited onto the back surface 302 of the wafer 200 as shown in FIG. 3B. The backmetal layer 304 may be composed of any suitable metal or metallic alloy and may be deposited using any suitable means. By way of example, the backmetal layer 304 may be an alloy of titanium, nickel and silver or an alloy of chromium, silver and tin, among others. After the deposition of the backmetal, the back surface of the wafer may be laser marked. The laser markings may identify projected saw streets or scribe lines. The markings may also refer to other types of information, such as production information or pin orientation. In step 110, active surface 206 of device wafer 200 is mounted on a first mount tape 306, as shown in FIG. 3C.

Figure 3D:
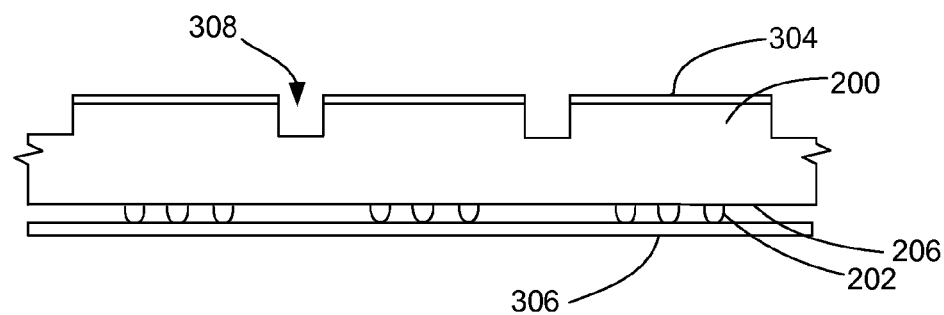
Figure 3E:
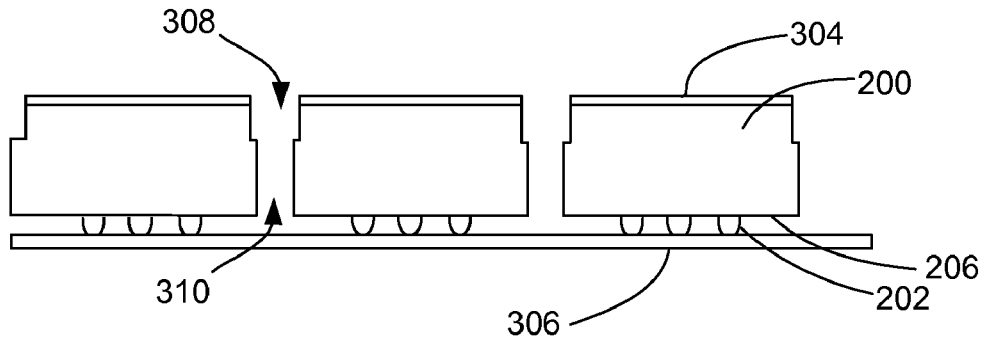

Step 112 entails a first cutting (e.g., sawing) operation that may generally proceed along saw streets 208 and which results in first saw kerfs 308, as illustrated in FIG. 3D. In the illustrated embodiment, the first cutting operation does not cut all the way through device wafer 200. Step 114 involves a narrower second sawing operation, resulting in second saw kerfs 310 of FIG. 3E. The second sawing operation cuts all the way through the device wafer 200, but does not cut completely through first mount tape 306, thus forming singulated dice that remain coupled with one another and in their original configuration on the first mount tape. The two-step sawing process results in singulated dice with recessed regions, as shown in FIG. 3E. The recessed regions may improve the performance and reliability of packages incorporating such dice. That is, when molding material is added to fill the recessed regions and form an integrated circuit package, the recessed regions have an "under-cradling effect" that locks the die within the molding material. It should be appreciated that the device wafer may be singulated using a variety of suitable techniques, including sawing, laser cutting and plasma cutting, and does not require the formation of such recessed regions.

Figure 3F:
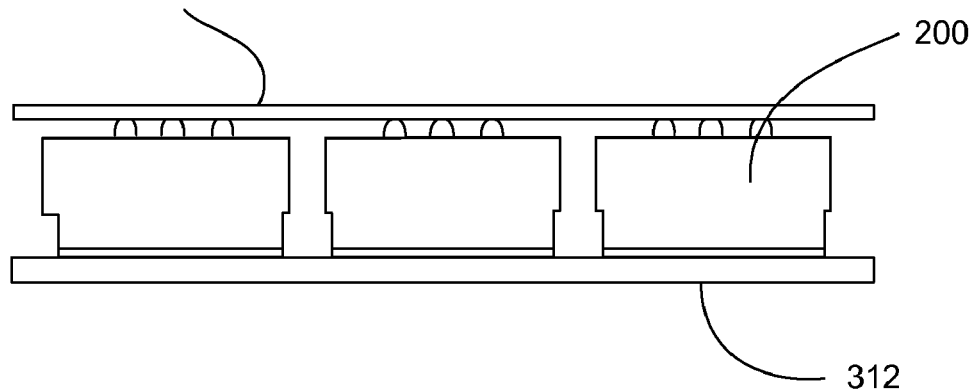
Figure 3G:
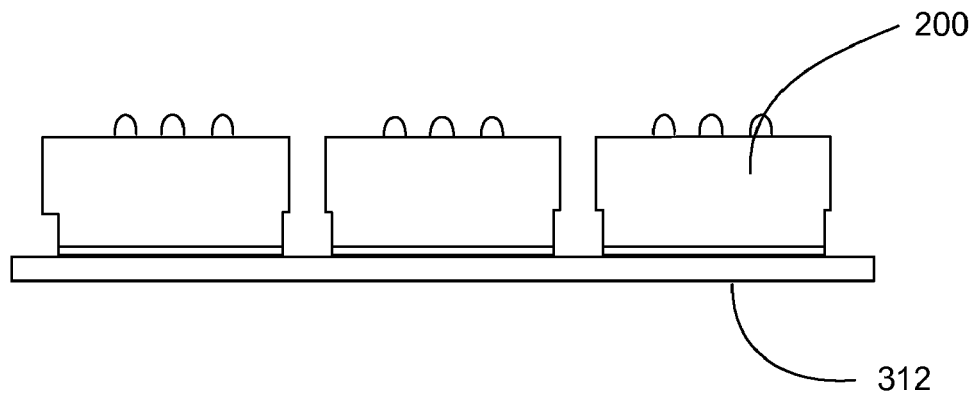
Figure 4:
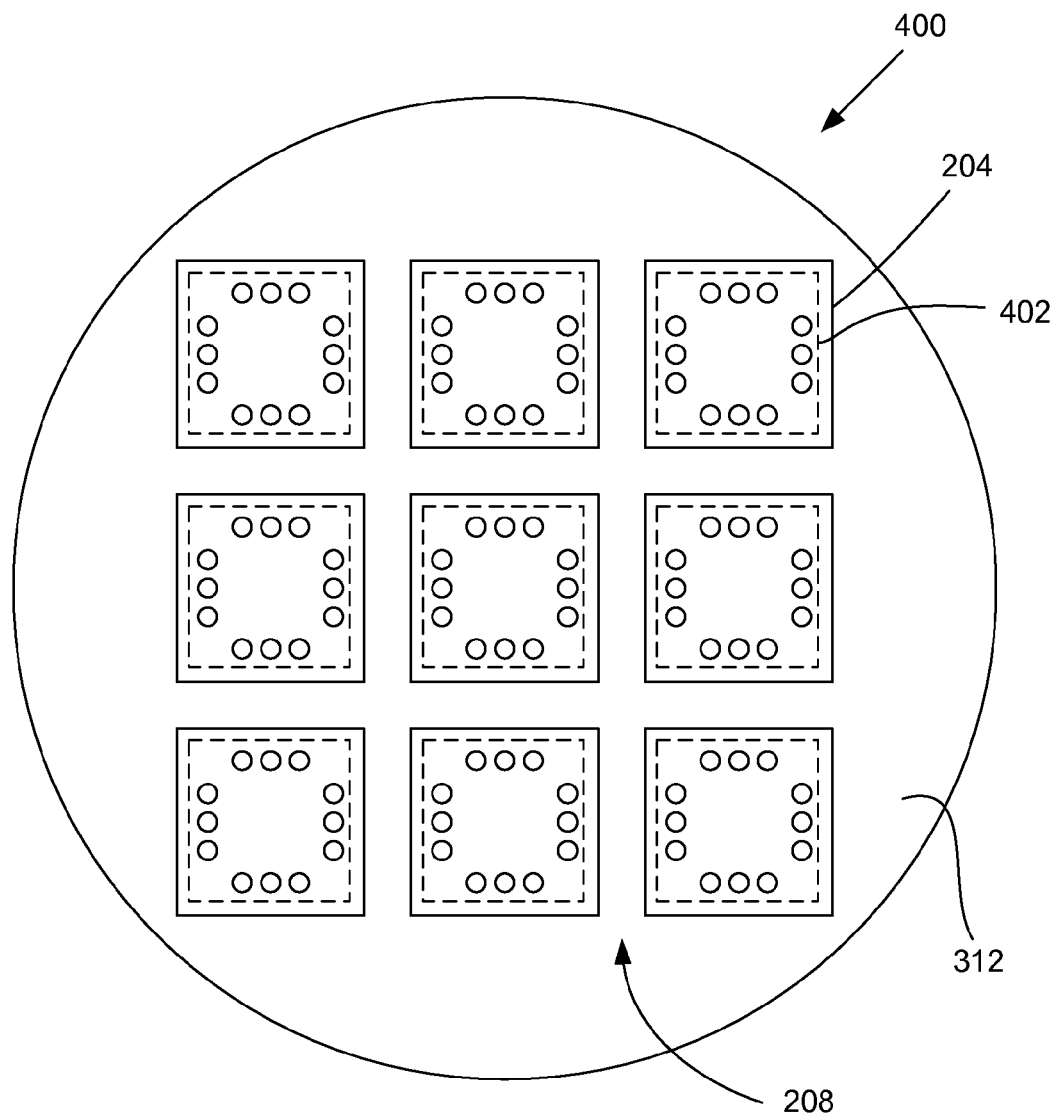
FIG. 4 illustrates a diagrammatic top view of a singulated device wafer.

Step 116 entails mounting the back surface 302 of singulated device wafer 200 onto a second mount tape 312 as illustrated in FIG. 3F. The second mount tape is preferably suitable for use under high temperatures such as those encountered during reflow and/or other conventional processes. First mount tape 306 is removed in step 118, as shown in FIG. 3G. FIG. 4 is a diagrammatic top view of the example device wafer 200 illustrated in FIG. 2 after completion of process 100. In the illustrated embodiment, the dice 204 have been singulated and include recessed regions 402. The singulated dice 204 are coupled with one another through second mount tape 312. It should be appreciated that the singulated dice 204 in FIG. 4 remain in substantially the same configuration as they were prior to singulation of the wafer 200. That is, the positions of the dice 204 relative to one another have not changed from their arrangement prior to singulation. However, in some alternate embodiments, it may be desirable to alter the arrangement of the dice 204 relative to one another.

Figure 5:
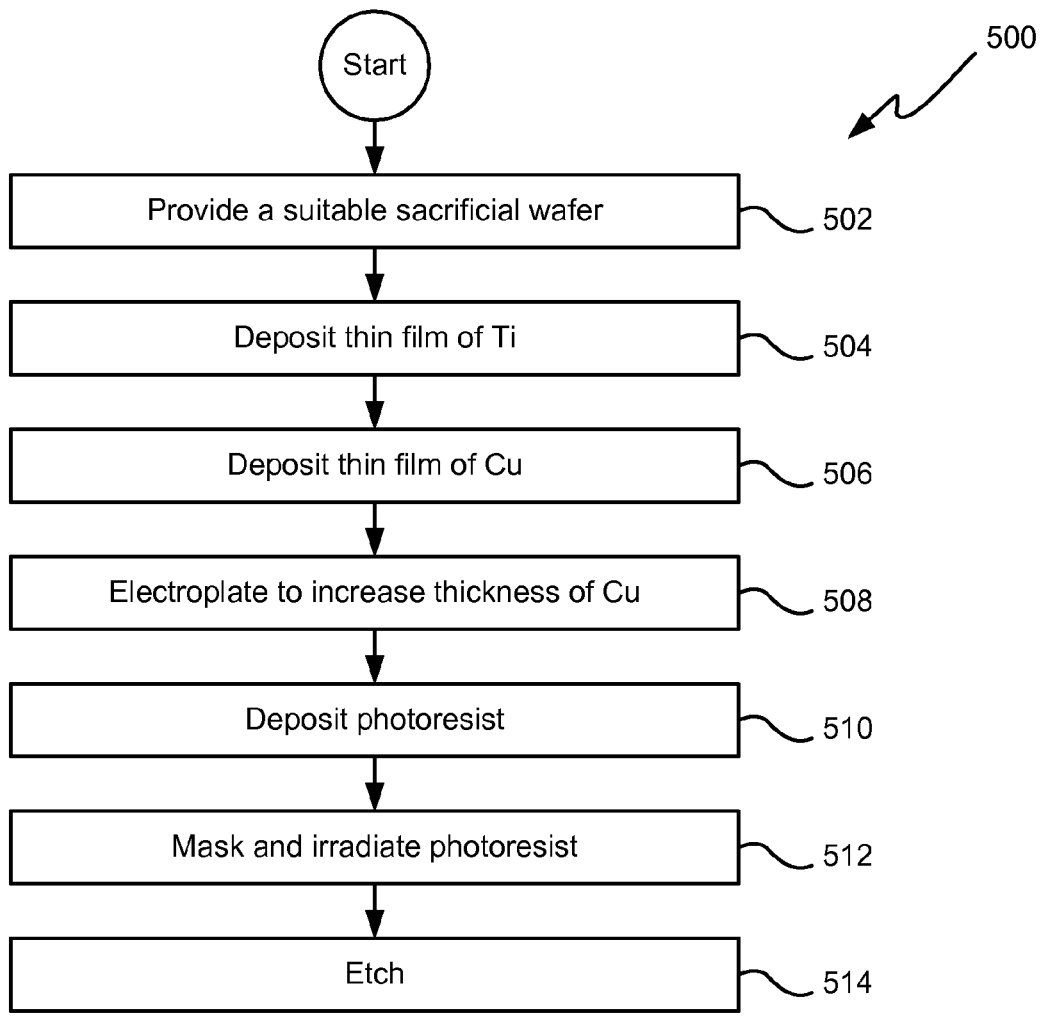
FIG. 5 is a flowchart illustrating a process of constructing a metalized sacrificial wafer substrate suitable for use in the packaging of integrated circuits in accordance with one embodiment of the present invention.

Referring next to FIG. 5, and further in view of FIGS. 6A-F, a process 500 of constructing a sacrificial wafer substrate suitable for use in the packaging of integrated circuits in accordance with one embodiment of the present invention will be described. Aspects of this process are described in more detail in co-pending application Ser. No. 11/958,288 filed Dec. 17, 2007 and entitled METHODS AND SYSTEMS FOR PACKAGING INTEGRATED CIRCUITS; and co-pending application Ser. No. 11/484,144 filed Jul. 10, 2006 and entitled METHODS AND SYSTEMS FOR PACKAGING INTEGRATED CIRCUITS; both of which are hereby incorporated by reference herein in their entireties for all purposes.

Figure 6A:
FIGS. 6A-6F illustrate diagrammatic cross-sectional side views of a semiconductor wafer suitable for use as a sacrificial wafer substrate at various steps in the process shown in FIG. 5 in accordance with one embodiment of the present invention.
Figure 6B:
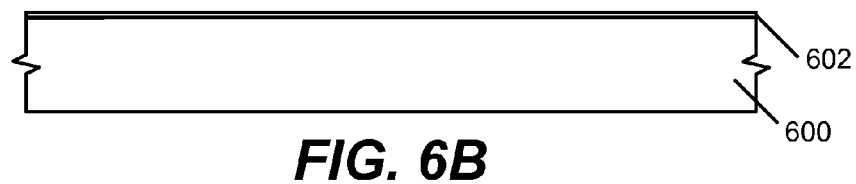

Initially, in step 502, a suitable sacrificial wafer 600 is provided, as shown in FIG. 6A. In a preferred embodiment, the wafer is a semiconductor wafer formed from a semiconductor material such as silicon, although any suitable material may be used. In order to prepare the wafer for use as a substrate, the wafer is first metalized. A wide variety of metallization techniques can be used to metallize the wafer. In the described embodiments, a thin film of titanium 602 is initially deposited in step 504 onto the front (top) surface of the sacrificial wafer 600 as is illustrated in FIG. 6B. Next, a thin film of copper 604 is deposited onto the thin film of titanium 602 in step 506. It should be noted that a copper alloy or other suitable conducting material may be used in place of the copper.

The titanium film 602 is sufficiently thick to serve as a barrier against copper migration. As is well known in the art, titanium films are often employed as barriers against copper poisoning, whereby copper migrates into a semiconductor wafer. In the described embodiment, the thin metallic films are deposited by sputtering, although other methods may be used, such as thermal evaporation, electroplating, or any other suitable method or combination of methods by which a thin uniform metallic film is deposited with an accurately controlled thickness.

Figure 6C:

FIG. 6C shows the sacrificial wafer 600 with the copper film 604 deposited onto the titanium film 602. In step 508, the copper film 604 may be electroplated to further grow the copper film to a desired thickness. It should be noted that the electroplating is not necessary if the copper film 604 that is originally deposited is already of the desired thickness. The copper film is generally grown to a thickness in the range of approximately 10 to 20 microns. However, both thicker and thinner films are readily attainable and may be used to meet the needs of any particular package.

Figure 6D:
Figure 6E:
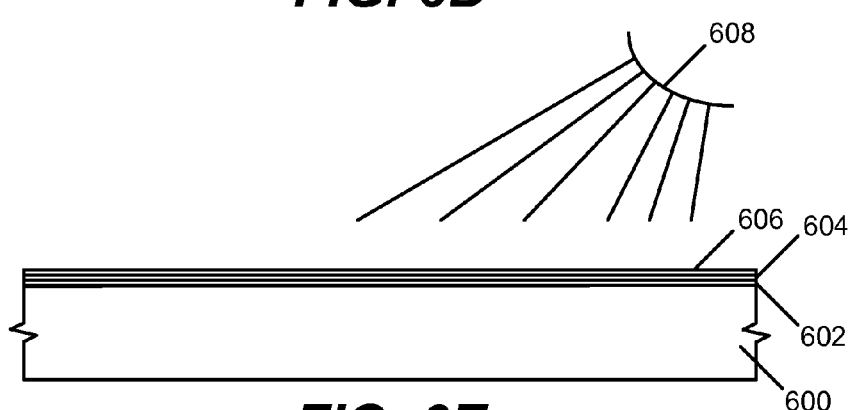
Figure 6F:
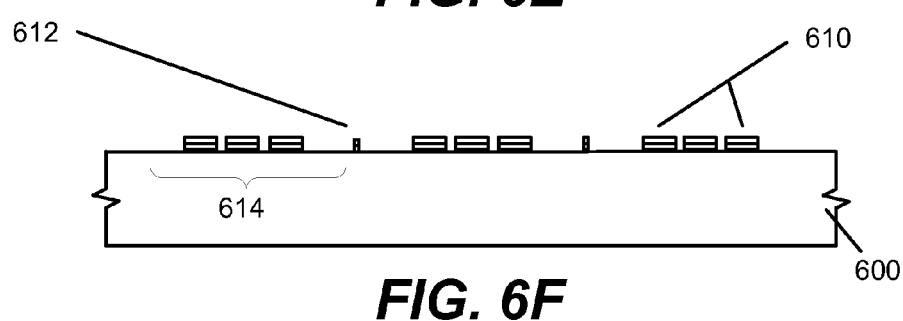

After the metallization has been applied to the wafer, it is patterned to define a multiplicity of device areas suitable for use in the packaging of integrated circuits. A wide variety of conventional patterning techniques can be used to pattern the wafer appropriately. By way of example, in the described embodiment, a photoresist 606 is subsequently deposited onto the copper film 604 in step 510. FIG. 6D illustrates the photoresist 606 deposited on top of the copper film 604. The photoresist 606 may be a positive photoresist, whereby the portion of the photoresist that is exposed to light becomes soluble to a photoresist developer, or a negative photoresist, whereby the portion of the photoresist that is unexposed to light is soluble and is dissolved by a photoresist developer. In step 512, the photoresist 606 is masked according to a desired pattern and irradiated with a light source 608, as illustrated in FIG. 6E.

In step 514, the photoresist 606 is then exposed to the photoresist developer and the metallic films 602 and 604 are etched. It should be noted that other suitable means of patterning and etching may be used as well. The etched pattern defines a plurality of device areas 614 suitable for use in the packaging of integrated circuits. In the embodiment illustrated in FIG. 6F, the metallic films 602 and 604 are patterned and etched such that each device area includes an array of contacts 610 and sacrificial saw street structures 612. The metalized sacrificial saw streets structures 612 are arranged into associated saw streets and are called as such because they may serve as marker lines indicating where the device areas are to be sawed or singulated.

It should be appreciated that the underlying sacrificial wafer eliminates the need for the use of tie bars and/or other structures to support the contacts 610 and various other features as is required in conventional leadframes. Eliminating the tie bars and various other supporting structures potentially permits the device areas to be packed more tightly as well as allowing for thinner packages. By way of example, based on a 2×2 mm package size, approximately 750 such packages may be formed from a standard leadframe strip whereas approximately 3750 units may be formed from a 6 in diameter wafer and approximately 6700 units may be formed from an 8 in diameter wafer.

Figure 7:
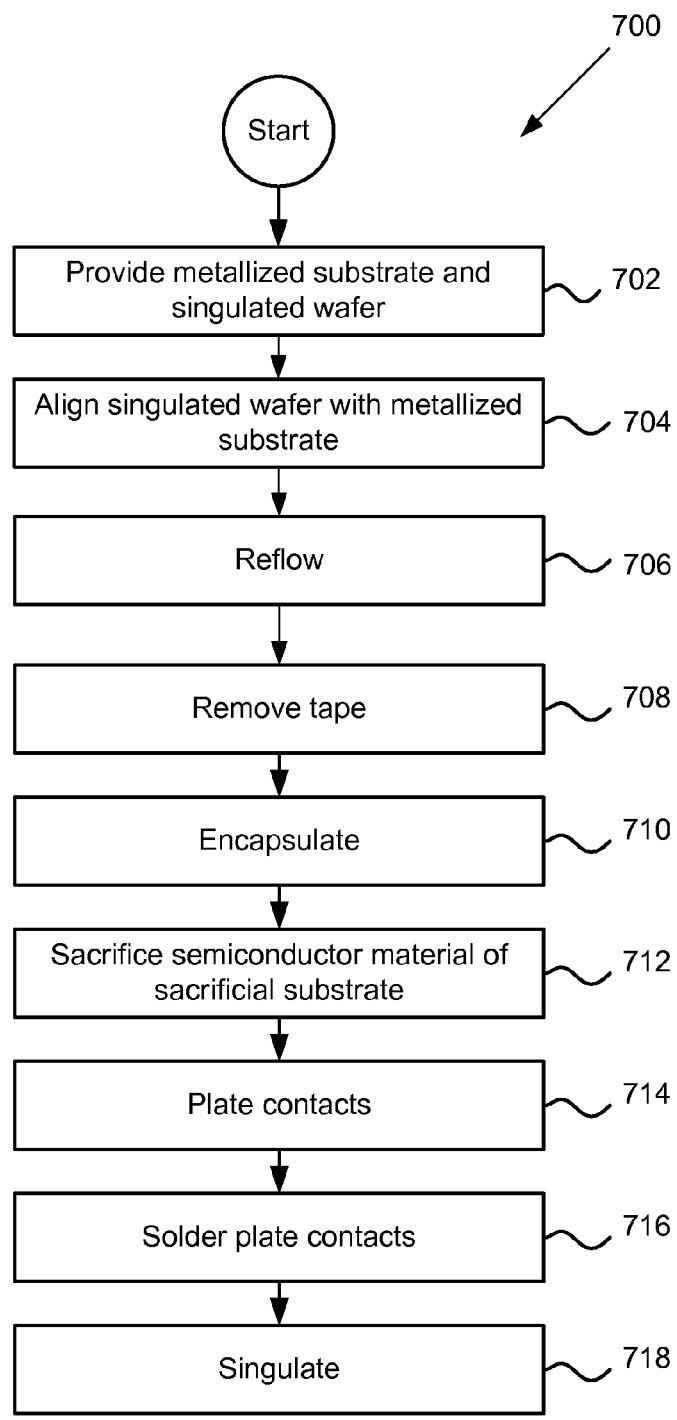
FIG. 7 is a flow chart illustrating a process of attaching a singulated device wafer to a metalized substrate and forming integrated circuit packages in accordance with one embodiment of the present invention.
Figure 8A:
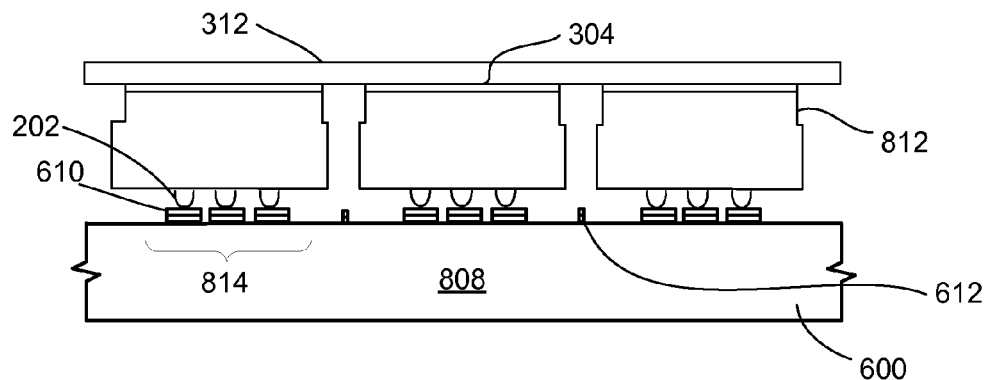
FIGS. 8A-8H illustrate diagrammatic cross-sectional side views of a device wafer and a metalized substrate at various steps in the process shown in FIG. 7 in accordance with one embodiment of the present invention.

Referring next to FIG. 7 and further in view of FIGS. 8A-8H, an example process 700 for attaching a singulated device wafer to a metalized substrate will be described. In step 702, metalized sacrificial wafer substrate 808 and singulated device wafer are provided, as shown in FIG. 8A. In the illustrated embodiment, substrate 808 includes device areas 814 and may be formed through the process illustrated in FIGS. 5 and 6A-6F. The singulated device wafer, which includes dice 812 having solder bumps 202, and which are mounted onto mount tape 312, may be formed through the process illustrated in FIGS. 1 and 3A-3G. More particularly, according to various embodiments, the dice 812 remain in their original configuration as they were prior to singulation from their associated wafer. In effect, the dice 812 remain in the form of a pseudo-wafer. That is, although the dice are no longer connected directly to one another, they are in the same configuration that they were in prior to singulation. Having the dice 812 coupled to the tape 312 facilitates the handling of the dice as a pseudo-wafer and allows the dice to remain in the desired configuration. The dice 812, in pseudo-wafer form, are aligned as a whole with substrate 808 at step 704 such that dice 812 are positioned substantially simultaneously over associated device areas 814 on substrate 808. More particularly, the dice 812 are positioned such that I/O pads on the active surfaces of the dice are aligned with corresponding contacts 610 on the substrate 808.

Figure 8B:
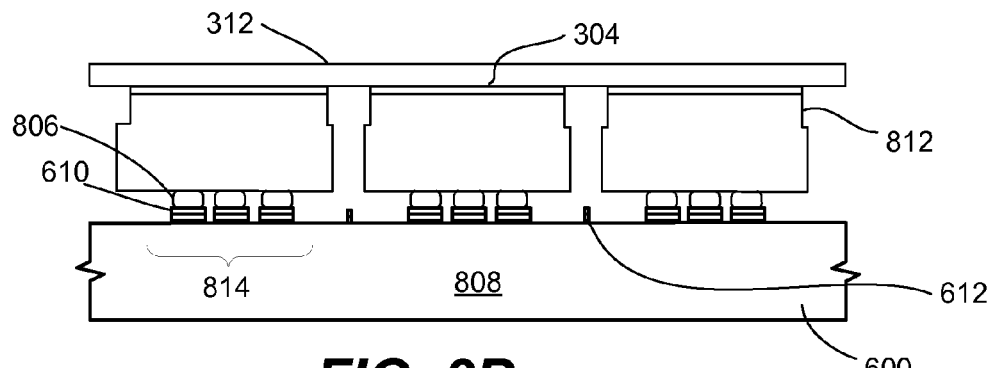
Figure 8C:
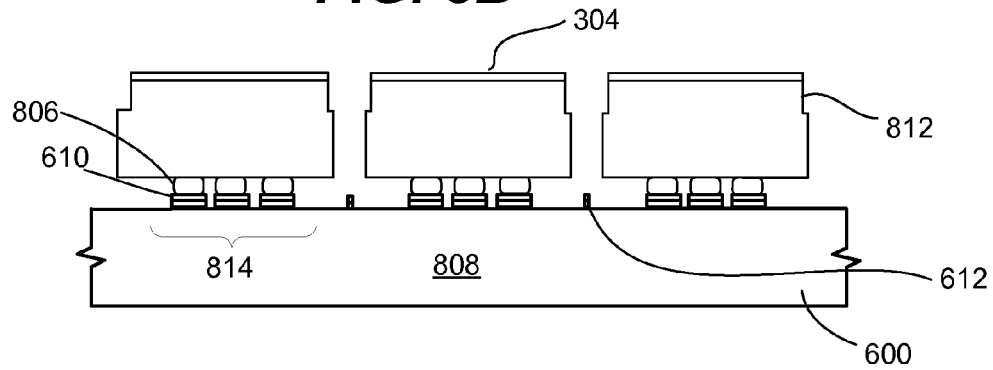

In step 706, the dice 812 may then be secured to their respective device areas on substrate 808 by reflowing the solder bumps 202. As shown in FIG. 8B, the reflowing of the solder bumps 202 forms solder joints 806 that physically and electrically connect the I/O pads on the active surfaces 206 of dice 812 to associated contacts 610 within device areas 814 of substrate 808. Subsequently, in step 708, the mount tape 312 may be removed as shown in FIG. 8C.

It should be appreciated that positioning and attaching dice in this manner may expedite the formation of integrated circuit packages as singulated dice from an entire wafer can be attached substantially simultaneously to a suitable substrate, instead of being positioned and/or attached one at a time as in typical die attach processes. As already described, in various preferred embodiments, the singulated dice remain in substantially the same configuration or spatial organization that they had prior to singulation from their respective wafer. In other embodiments, the singulated dice have a spatial organization that is similar or proportional to the spatial organization that they had prior to singulation. By way of example, the spacing between the dice 812 may be enlarged uniformly by stretching the tape 312.

Figure 8D:
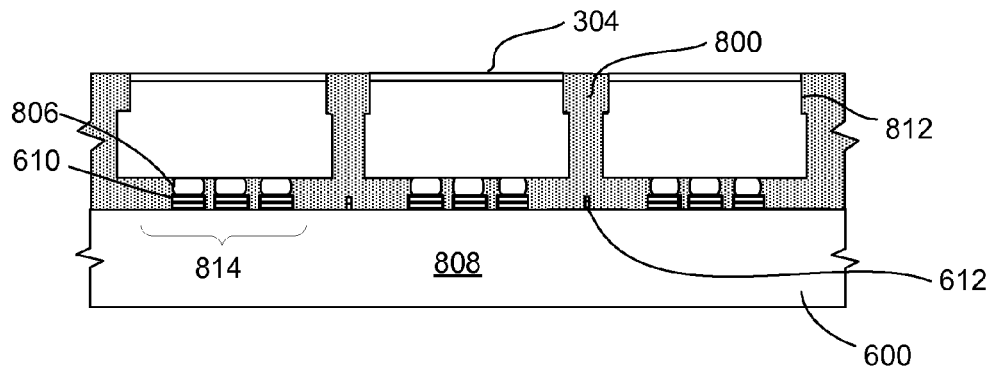

In step 710, the front surface of the metalized substrate 808 is then encapsulated with a molding material 800 such that the molding material covers the contacts 610 and the dice 812, as illustrated in FIG. 8D. A variety of known encapsulation techniques such as film assisted molding (FAM), glob topping, screen printing, or stencil printing may be used to encapsulate the device areas. In various embodiments, the device areas 814 are encapsulated substantially simultaneously, such as with a FAM system. Generally, it is desirable for the encapsulant to cover all of the device areas so that when the semiconductor material of the metalized substrate 808 is later sacrificed, the encapsulant material will hold all of the devices together. However, this is not a requirement. By way of example, in some embodiments, each device area may be encapsulated individually or with a mold that includes a separate mold cavity for each device area. In these embodiments, a wafer mount tape or other support structure may be required to hold the device areas together when substrate 808 is sacrificed. Additionally, in embodiments in which the dice 812 include a backmetal layer 304 on the back surface of the dice, the dice may be encapsulated in such a way as to prevent molding material from covering or intruding over the backmetal layers 304.

Figure 8E:
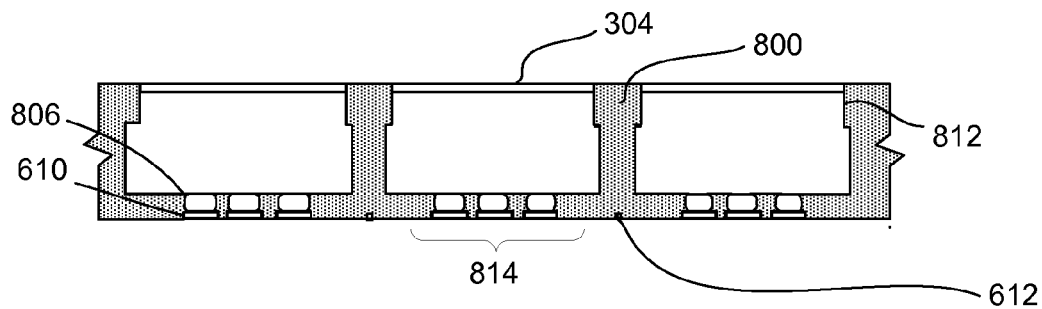

The semiconductor material of metalized sacrificial substrate 808 is then sacrificed in step 712 leaving the metalized contacts 610 exposed, as is illustrated in FIG. 8E. Removing the semiconductor material leaves the metalized contacts suitable for use as electrical connections to external devices such as printed circuit boards (PCBs). The semiconductor material may be sacrificed by any suitable means. In the preferred embodiment, the semiconductor material is subjected to a backgrind operation until the contacts 610 are exposed, and in various embodiments, until the titanium portions of the contacts are removed. In some embodiments, the backgrind operation may continue until a few microns of the contacts 610 themselves are ground away, thus providing more assurance that all of the contacts 610 are exposed.

Figure 8F:
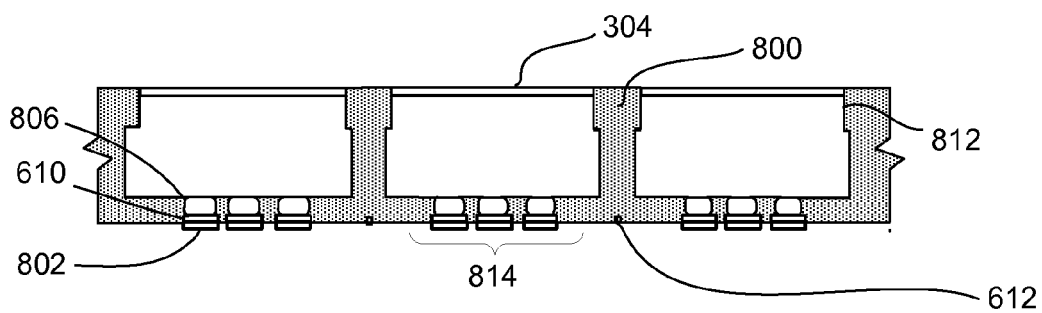
Figure 8G:
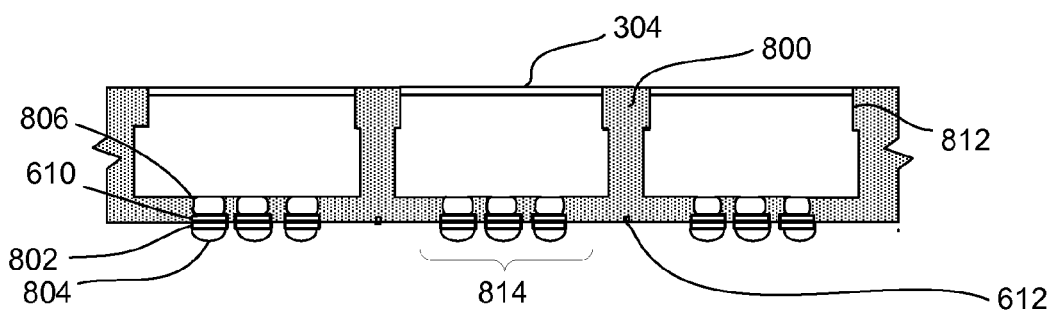

It may often be desirable to form solder bumps 804 on each of the contacts 610 (i.e., bump the devices) while still at this "panel" level. In the described embodiment, the contacts 610 are solder plated, although any suitable method may be used to solder coat the contacts 610. As mentioned above, the metalized contacts 610 are generally formed from a material such as copper that corrodes when exposed to ambient air and/or does not adhere well to certain solders. Therefore, as will be appreciated by those familiar with packaging in general, in some situations, it may also be desirable to plate the contacts 610 by applying one or more metallization layers 802 onto the contacts 610 prior to solder plating. By way of example, lead or lead-based alloys work well. This plating is carried out in step 714 and is illustrated in FIG. 8F. Subsequently, the contacts 610 may then be solder-plated or otherwise bumped at step 716, as illustrated in FIG. 8G.

Figure 8H:
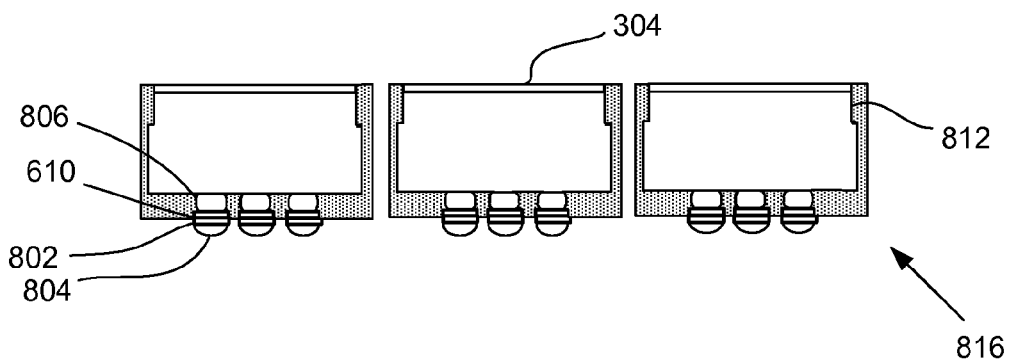

In step 718, the device areas 814 may then be singulated along the saw street structures 612 by sawing, laser cutting, plasma etching or other suitable means, thereby providing a plurality of singulated integrated circuit packages 816, as shown in FIG. 8H. It should be noted that the metalized saw street structures 612 are typically substantially obliterated during device singulation. However, in contrast to conventional leadframes, the small thickness of the saw street structures 612 (approximately 10 to 20 microns), as compared to conventional leads (approximately 100 to 200 microns), allows for much improved saw blade life. After device singulation, the IC packages may then be electrically tested again. This second round of testing is advantageous as the process of singulation is potentially capable of breaking the electrical bonds. Subsequently, the singulated packages may be taped and reeled.

It should be appreciated that the small thickness of the contacts 610 and various other structures means less metal is required. Moreover, this means that the contacts 610 and various other structures, themselves, on the metalized substrate 808 won't necessarily be the constraint determining the resultant package thickness.

Additionally, as alluded to earlier, the described methods are useful in packaging dice having a wide variety of footprints (length and width dimensions). More specifically, the contacts on the sacrificial substrate can be patterned and arranged to correspond to dice having a variety of sizes and shapes and a wide variety of I/O pad layouts. Additionally, the described methods may be used to attach dice at a pseudo-wafer level to device areas on a substrate even if the dice in the wafer vary in size relative to one another.

Finally, although process 700 has been described with reference to attaching the dice to a substrate that incorporates a sacrificial semiconductor wafer, it should be appreciated that in alternate embodiments, other suitable substrates may be used. By way of example, a standard metallic leadframe panel could be designed and constructed to have a device area configuration that is suitable for attaching the dice while the dice are still at the pseudo-wafer-level.

Although only a few embodiments of the invention have been described in detail, it should be appreciated that the invention may be implemented in many other forms without departing from the spirit or scope of the invention. Therefore, the present embodiments should be considered as illustrative and not restrictive and the invention is not limited to the details given herein, but may be modified within the scope and equivalents of the appended claims.

What is claimed is:

1. A method for packaging integrated circuit devices, comprising:
   providing a singulated device wafer, the singulated device wafer being a wafer that has been singulated to form a multiplicity of integrated circuit dice arranged in a first configuration, each die having an active surface and a back surface, the active surface of each die having a plurality of I/O pads formed thereon;
   providing a substrate including a sacrificial semiconductor wafer, the substrate having a first surface, wherein a multiplicity of device areas are formed on the first surface of the substrate and are arranged into a second configuration and wherein each device area includes an array of metalized contacts;
   aligning the dice as a whole with the second configuration of device areas such that the dice are positioned substantially simultaneously over the device areas on the substrate;
   attaching the dice from the singulated device wafer as a whole substantially simultaneously to the substrate such that each die is attached to an associated one of the device areas;
   after attaching the dice to the substrate, encapsulating at least a portion of each of the dice and at least a portion of each of the metalized contacts with a molding material such that the molding material fills in gaps between the dice; and
   after the encapsulating of the dice and the contacts, sacrificing semiconductor material of the sacrificial substrate such that portions of the contacts are exposed to serve as electrical contacts for the dice, wherein the molding material helps hold the dice and the multiplicity of device areas together during the sacrificing operation.

2. The method as recited in claim 1, wherein solder bumps are formed over selected ones of the plurality of I/O pads and wherein the active surfaces of the dice are positioned over associated device areas.

3. The method as recited in claim 2, wherein the attaching of the dice to the device areas includes reflowing the solder bumps to physically and electrically connect the selected ones of the plurality of I/O pads on the active surfaces of the dice to corresponding contacts within the device areas.

4. A method as recited in claim 1, wherein the sacrificing of the sacrificial semiconductor wafer is performed by backgrinding the sacrificial semiconductor wafer until at least a portion of each contact is exposed.

5. A method as recited in claim 1, further comprising singulating the device areas to form a multiplicity of integrated circuit die packages.

6. A method as recited in claim 1, wherein the singulated dice remain substantially in the first configuration after the dice are encapsulated with the molding material.

7. A method as recited in claim 1, wherein there are no tie bars that extend between device areas to hold the device areas together.

8. A method as recited in claim 7, wherein the sacrificing of the substrate involves grinding away the substrate such that the substrate no longer holds together and physically supports the multiplicity of device areas.

9. A method as recited in claim 1, wherein the singulation of the device wafer involves a first cutting process and a distinct second cutting process, the first cutting process cutting partially and not entirely through the wafer, wherein the second cutting process further deepens a cut in the wafer made by the first cutting process, wherein the first and second cutting processes forms a recessed region in each singulated die that helps lock the die within molding material.

10. A method for attaching a multiplicity of integrated circuit dice to a substrate, comprising:
providing an unsingulated device wafer, the device wafer including a multiplicity of integrated circuit dice arranged in a first configuration, each die having an active surface and a back surface, the back surfaces of the dice cooperating to form the back surface of the device wafer, the active surfaces of the dice cooperating to form the active surface of the device wafer, the active surface of each die having a plurality of solder bumps formed thereon;
adhering the active surface of the unsingulated device wafer to a first tape;
singulating the device wafer such that the multiplicity of dice remain in the first configuration;
adhering the back surface of the singulated device wafer to a second tape as a whole such that the dice remain in the first configuration;
removing the first tape from the active surface of the singulated wafer;
providing a substrate, the substrate including a multiplicity of device areas arranged on the substrate in a second configuration, each device area having a plurality of metalized contacts that are formed on a first surface of the substrate;
aligning the first configuration of dice as a whole with the second configuration of device areas such that active surfaces of the dice are positioned substantially simultaneously over associated device areas on the substrate and such that selected solder bumps are aligned with corresponding contacts on the substrate;

attaching the dice from the singulated device wafer as a whole substantially simultaneously to the substrate such that each die is attached to an associated device area and wherein the solder bumps on the active surface of each die are attached to corresponding contacts on the associated device area;
after attaching the dice to the substrate, encapsulating at least a portion of each of the dice and at least a portion of each of the metalized contacts with a molding material such that the molding material fills in gaps between the dice; and
after the encapsulating of the dice and contacts, sacrificing the substrate such that portions of the contacts are exposed to serve as electrical contacts for the dice, wherein the molding material helps hold the dice and the multiplicity of device areas together during the sacrificing operation.

11. The method as recited in claim 10, wherein the attaching is accomplished by reflowing the solder bumps to physically and electrically connect I/O pads on the dice to contacts within the device areas.

12. The method as recited in claim 10, further comprising removing the second tape after the dice are attached to the substrate and before the dice are encapsulated.

13. The method as recited in claim 10, wherein the substrate is formed from a sacrificial semiconductor wafer, the method further comprising metalizing the first surface of the substrate to form the contacts.

14. A method as recited in claim 13, wherein the sacrificing of the sacrificial semiconductor wafer is performed by backgrinding the sacrificial semiconductor wafer until at least a portion of each contact is exposed.

15. A method as recited in claim 14, further comprising singulating the device areas to form a multiplicity of integrated circuit die packages.

16. A method as recited in claim 13, further comprising singulating the device areas to form a multiplicity of integrated circuit die packages.

17. A method as recited in claim 10, further comprising metallizing the back surface of the device wafer prior to singulating the device wafer, wherein during the encapsulating, the metallization on the back surfaces of the dice are left exposed and unencapsulated by the molding material used to encapsulate other portions of the dice.

18. A method as recited in claim 10, further comprising removing the second tape after the dice are attached to the substrate.

19. A method as recited in claim 10, further comprising stretching the second tape prior to aligning the dice with the second configuration of device areas such that the dice that are adhered with the second tape are in a third configuration that is different from and proportional to the first configuration and wherein the dice remain in the third configuration after the dice are encapsulated with the molding material.

* * * * *